United States Patent
Lim

(10) Patent No.: US 9,954,122 B2
(45) Date of Patent: Apr. 24, 2018

(54) SOLAR CELL APPARATUS AND METHOD OF FABRICATING THE SAME

(71) Applicant: LG INNOTEK CO., LTD., Seoul (KR)

(72) Inventor: Chin Woo Lim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 628 days.

(21) Appl. No.: 14/352,806

(22) PCT Filed: Oct. 16, 2012

(86) PCT No.: PCT/KR2012/008445
§ 371 (c)(1),
(2) Date: Apr. 18, 2014

(87) PCT Pub. No.: WO2013/058522
PCT Pub. Date: Apr. 25, 2013

(65) Prior Publication Data
US 2014/0261679 A1  Sep. 18, 2014

(30) Foreign Application Priority Data
Oct. 18, 2011  (KR) .................. 10-2011-0106370

(51) Int. Cl.
*H01L 31/0224* (2006.01)
*H01L 31/0463* (2014.01)

(52) U.S. Cl.
CPC ........... *H01L 31/022441* (2013.01); *H01L 31/022425* (2013.01); *H01L 31/0463* (2014.12); *Y02E 10/50* (2013.01)

(58) Field of Classification Search
None
See application file for complete search history.

(56) References Cited

U.S. PATENT DOCUMENTS 4,171,989 A * 10/1979 Pryor .............. H01L 31/022433
                                                              136/256
2008/0121264 A1* 5/2008 Chen .................. H01L 31/18
                                                              136/244

(Continued)

FOREIGN PATENT DOCUMENTS

JP    2006073707 A  *  3/2006  .......... H01L 31/048
KR  10-2011-0041248 A     4/2011

(Continued)

OTHER PUBLICATIONS

Society of Manufacturing Engineers "Holemaking" Fundamental Manufacturing Processes Study Guide, DV09PUB3, www.sme.org/WorkArea/DownloadAsset.aspx?id=73764 accessed Oct. 31, 2016.*

(Continued)

*Primary Examiner* — Magali P Slawski
(74) *Attorney, Agent, or Firm* — Saliwanchik, Lloyd & Eisenschenk

(57) ABSTRACT

A solar cell apparatus according to the embodiment includes the steps of a support substrate; a back electrode layer on the support substrate; a light absorbing layer on the back electrode layer; a buffer layer on the light absorbing layer; and a front electrode layer on the buffer layer, wherein the back electrode layer comprises: a first electrode part having a first thickness; and a second electrode part adjacent to the first electrode part and having a second thickness less than the first thickness. A method for fabricating a solar cell apparatus according to the embodiment includes the steps of forming a back electrode layer on a substrate; etching the back electrode layer; forming a light absorbing layer on the back electrode layer; forming a buffer layer on the light absorbing layer; and forming a front electrode layer on the buffer layer.

13 Claims, 4 Drawing Sheets

(56) References Cited

U.S. PATENT DOCUMENTS

| | | | | |
|---|---|---|---|---|
| 2008/0178925 | A1* | 7/2008 | Wu | H01L 31/02243 136/244 |
| 2010/0252105 | A1* | 10/2010 | Fork | B29C 47/026 136/256 |
| 2011/0210362 | A1* | 9/2011 | Lee | H01L 33/382 257/98 |
| 2011/0259423 | A1* | 10/2011 | Korevaar | H01L 31/022425 136/260 |
| 2012/0103416 | A1 | 5/2012 | Kwon et al. | |
| 2012/0186634 | A1* | 7/2012 | Jee | H01L 31/0749 136/252 |
| 2015/0151675 | A1* | 6/2015 | Lefevre | B32B 17/10 362/520 |

FOREIGN PATENT DOCUMENTS

KR   10-2011-0048732 A   5/2011
KR   10-2011-0049971 A   5/2011

OTHER PUBLICATIONS

Translation of Osawa, JP 2006073707 A.*
International Search Report in International Application No. PCT/KR2012/008445, filed Oct. 16, 2012.

* cited by examiner

[Fig. 1]
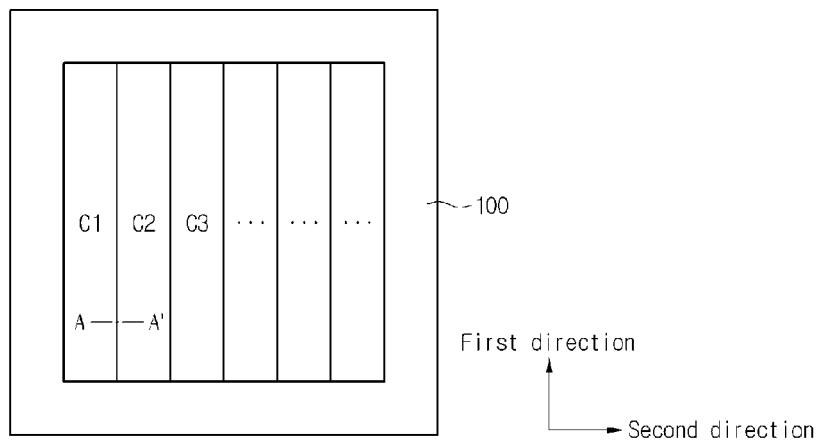
[Fig. 2]
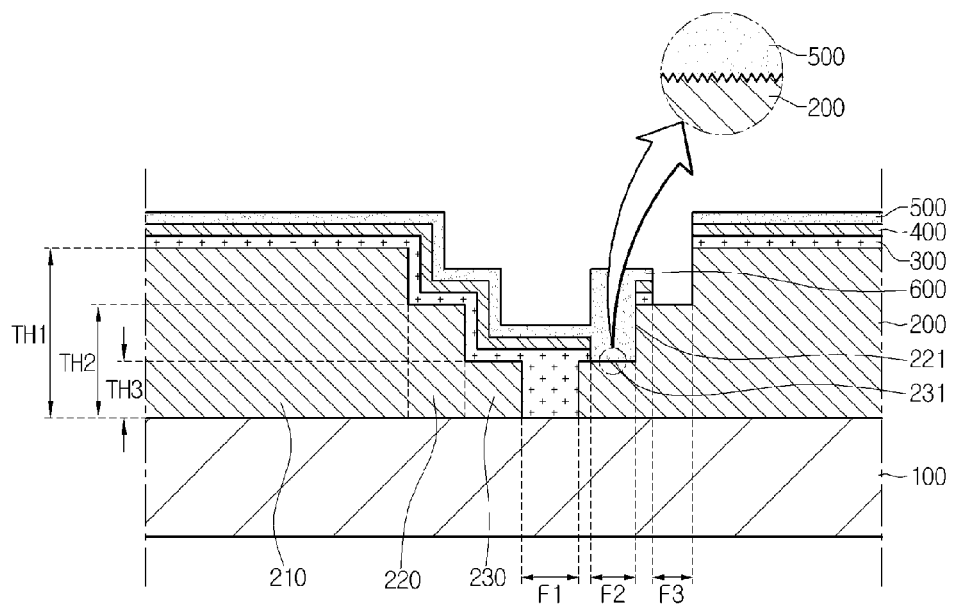
[Fig. 3]
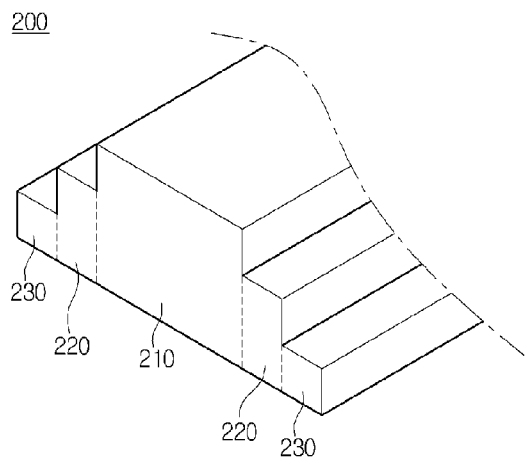

[Fig. 4]
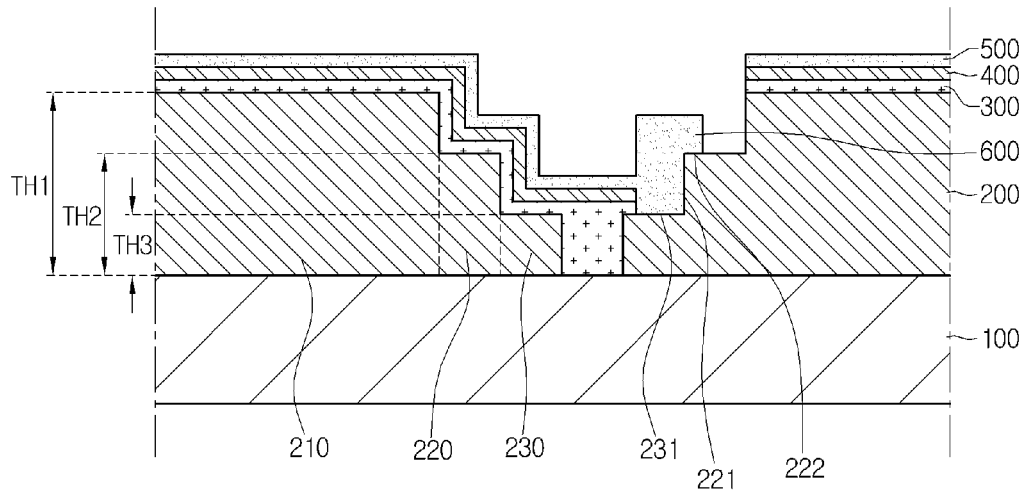
[Fig. 5]
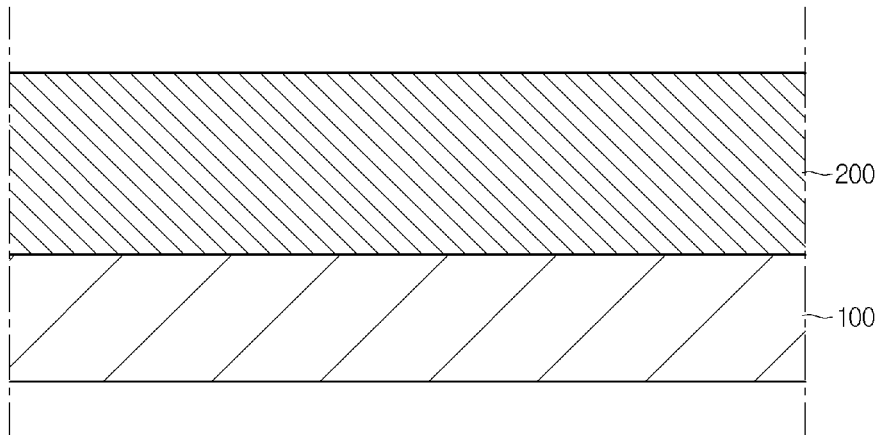
[Fig. 6]
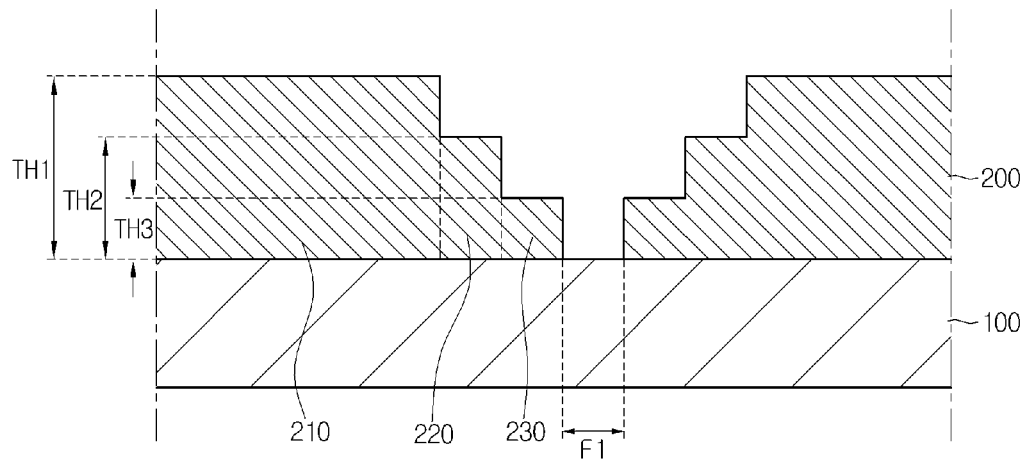

[Fig. 7]
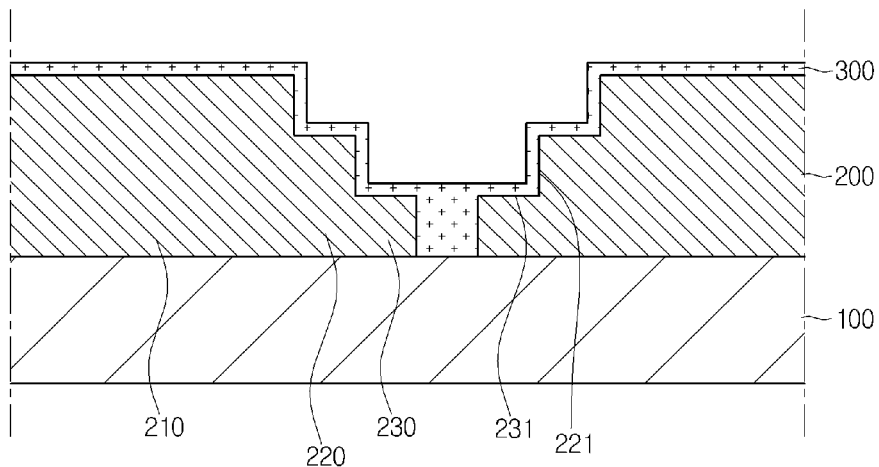
[Fig. 8]
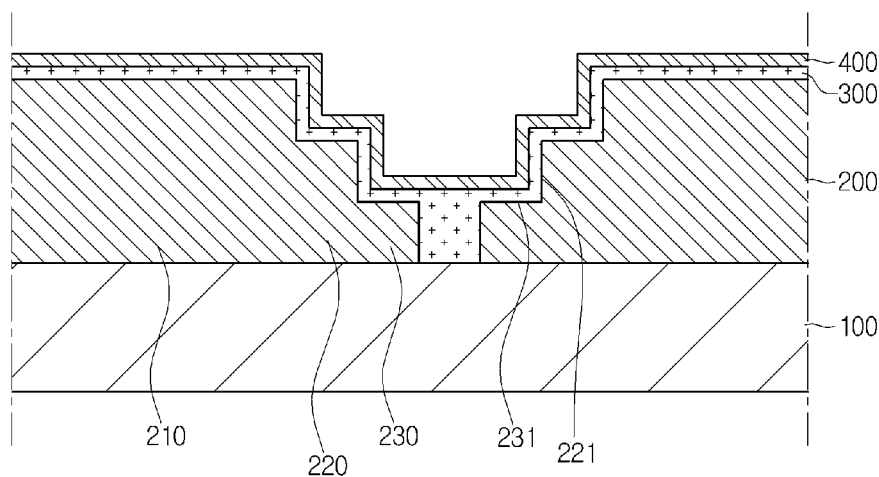
[Fig. 9]
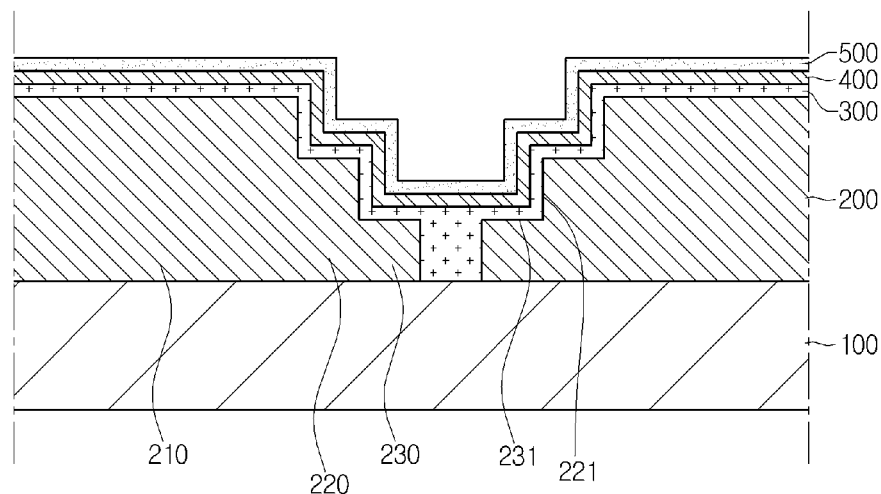

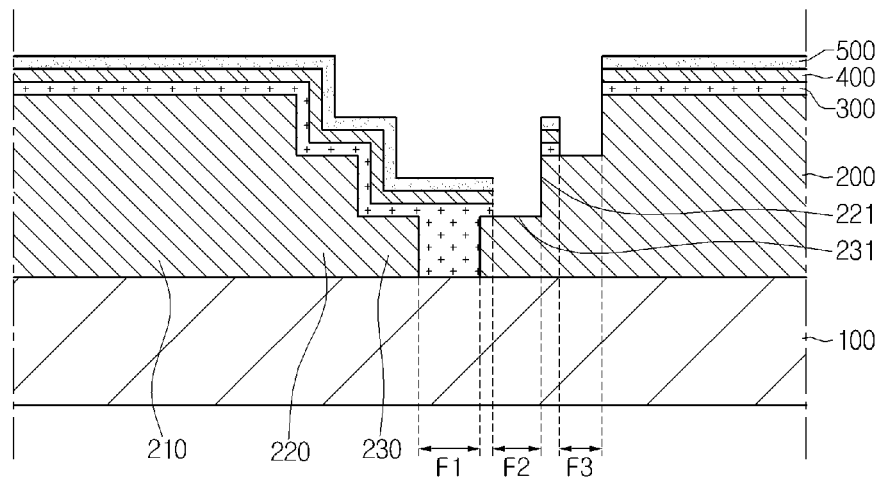
[Fig. 10]
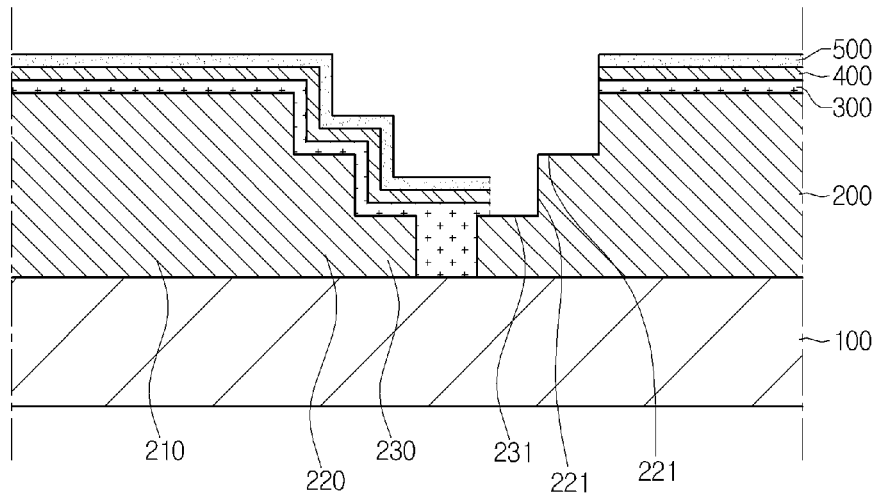
[Fig. 11]

SOLAR CELL APPARATUS AND METHOD OF FABRICATING THE SAME

CROSS-REFERENCE TO RELATED APPLICATIONS

This application is the U.S. national stage application of International Patent Application No. PCT/KR2012/008445, filed Oct. 16, 2012, which claims priority to Korean Application No. 10-2011-0106370, filed Oct. 18, 2011, the disclosures of each of which are incorporated herein by reference in their entirety.

TECHNICAL FIELD

The embodiment relates to a solar cell apparatus and a method of fabricating the same.

BACKGROUND ART

A method of fabricating a solar cell for solar photovoltaic power generation is as follows. First, after preparing a substrate, a back electrode layer is formed on the substrate and patterned by using a laser device, thereby forming a plurality of back electrodes.

Thereafter, a light absorbing layer, a buffer layer, and a high resistance buffer layer are sequentially formed on the back electrodes. Various schemes, such as a scheme of forming a Cu(In,Ga)Se2 (CIGS) based-light absorbing layer by simultaneously or separately evaporating Cu, In, Ga, and Se and a scheme of performing a selenization process after a metallic precursor film has been formed, have been extensively used in order to form the light absorbing layer. The energy band gap of the light absorbing layer is in the range of about 1 eV to about 1.8 eV.

Then, a buffer layer including cadmium sulfide (CdS) is formed on the light absorbing layer through a sputtering process. The energy bandgap of the buffer layer may be in the range of about 2.2 eV to about 2.4 eV. After that, the high resistance buffer layer including zinc oxide (ZnO) is formed on the buffer layer through the sputtering process. The energy bandgap of the high resistance buffer layer is in the range of about 3.1 eV to about 3.3 eV.

Thereafter, a groove pattern may be formed in the light absorbing layer, the buffer layer, and the high resistance buffer layer.

Then, a transparent conductive material is laminated on the high resistance buffer layer, and is filled in the groove pattern. Therefore, a transparent electrode layer is formed on the high resistance buffer layer, and connection wires are formed in the groove pattern. A material constituting the transparent electrode layer and the connection wireless may include aluminum doped zinc oxide (AZO). The energy bandgap of the transparent electrode layer may be in the range of about 3.1 eV to about 3.3 eV.

Then, the groove pattern is formed in the transparent electrode layer, so that a plurality of solar cells may be formed. The transparent electrodes and the high resistance buffers correspond to the cells, respectively. The transparent electrodes and the high resistance buffers may be provided in the form of a stripe or a matrix.

The transparent electrodes and the back electrodes are misaligned with each other, so that the transparent electrodes are electrically connected to the back electrodes through the connection wires, respectively. Accordingly, the solar cells may be electrically connected to each other in series.

As described above, in order to convert the solar light into electrical energy, various solar cell apparatuses have been fabricated and used. One of the solar cell apparatuses is disclosed in Korean Unexamined Patent Publication No. 10-2008-0088744.

DISCLOSURE OF INVENTION

Technical Problem

The embodiment provides a solar cell apparatus capable of preventing a short circuit and having improved performance and a method of fabricating the same.

Solution to Problem

According to the embodiment, there is provided a solar cell apparatus including the steps of a support substrate; a back electrode layer on the support substrate; a light absorbing layer on the back electrode layer; a buffer layer on the light absorbing layer; and a front electrode layer on the buffer layer, wherein the back electrode layer comprises: a first electrode part having a first thickness; and a second electrode part adjacent to the first electrode part and having a second thickness less than the first thickness.

According to one embodiment, there is provided a method for fabricating a solar cell apparatus including the steps of forming a back electrode layer on a substrate; etching the back electrode layer; forming a light absorbing layer on the back electrode layer; forming a buffer layer on the light absorbing layer; and forming a front electrode layer on the buffer layer.

Advantageous Effects of Invention

According to the solar cell apparatus of the embodiment, the back electrode layer has a step difference so that a contact area between the connection part and the back electrode layer can be increased. Thus, the contact resistance and the serial resistance can be reduced, and the fill factor can be increased. Therefore, the performance of the solar cell apparatus can be improved.

The method according to the embodiment can fabricate the solar cell apparatus having the above-described effects.

BRIEF DESCRIPTION OF DRAWINGS

FIG. 1 is a plan view showing a panel of a solar cell apparatus according to a first embodiment;

FIG. 2 is a sectional view taken along line A-A' of FIG. 1;

FIG. 3 is a perspective view showing a back electrode layer included in the panel of the solar cell apparatus according to the first embodiment;

FIG. 4 is a sectional view showing a solar cell apparatus according to a second embodiment light into the solar cell apparatus according to the embodiment; and FIGS. 5 to 10 are views illustrating a procedure of fabricating a panel of a solar cell apparatus according to a first embodiment.

FIG. 11 is a view illustrating a procedure of fabricating a panel of the solar cell apparatus according to the second embodiment.

MODE FOR THE INVENTION

In the description of the embodiments, it will be understood that when a layer, a film, a region, a pattern or a structure is referred to as being "on" or "under" another substrate, another layer, a film, or another pattern, it can be "directly" or "indirectly" on the other layer, the other film, the other pattern, or one or more intervening layers may also be present. Such a position of the layer has been described with reference to the drawings.

The size or thickness of the elements shown in the drawings may be exaggerated for the purpose of obvious and convenient explanation and may not utterly reflect the actual size.

Hereinafter, embodiments will be described in detail with reference to the accompanying drawings.

First, a solar cell apparatus according to the first embodiment will be described with reference to FIGS. 1 to 3. FIG. 1 is a plan view showing a panel of the solar cell apparatus according to the first embodiment. FIG. 2 is a sectional view taken along line A-A' of FIG. 1. FIG. 3 is a perspective view showing a back electrode layer included in the panel of the solar cell apparatus.

Referring to FIGS. 1 to 3, the solar cell panel includes a support substrate 100, a back electrode layer 200, a light absorbing layer 300, a buffer layer 400, a front electrode layer 500, and a plurality of connectors 600.

The support substrate 100 has a plate shape and supports the back electrode layer 200, the light absorbing layer 300, the buffer layer 400, the front electrode layer 500, and the connectors 600.

The support substrate 100 may include an insulator. The support substrate 100 may include a glass substrate, a plastic substrate, or a metallic substrate. In more detail, the support substrate 100 may include a soda lime glass substrate. The support substrate 100 may be transparent or may be rigid or flexible.

The back electrode layer 200 is provided on the support substrate 100. The back electrode layer 200 may be a conductive layer. The back electrode layer 200 may include a metal, such as molybdenum.

In addition, the back electrode layer 200 may include at least two layers. In this case, the layers may be formed by using the homogeneous metal or heterogeneous metals.

The back electrode layer 200 may include a first electrode part 210, a second electrode part 220, and a third electrode part 230.

The first electrode part 210 has a first thickness TH1. The first thickness TH1 may be 1 μm or less.

The second electrode part 220 is adjacent to the first electrode part 210, and has a second thickness TH2 thinner than the first thickness TH1.

The third electrode part 230 is adjacent to the second electrode part 220, and has a third thickness TH3 thinner than the second thickness TH2. The third thickness may be 500 μm or less.

The first to third electrode parts 210 to 230 may be integrally formed.

Therefore, referring to FIG. 3, a step difference may be formed in the back electrode layer 200.

Referring to FIG. 2, a top surface of the back electrode layer 200 is rough. The reason is that the back electrode layer 200 is formed through etching. Since the back electrode layer 200 is rough, a specific surface is increased so that short current density may be improved.

First through holes F1 are formed in the back electrode layer 200. The first through holes F1 are open regions to expose the top surface of the support substrate 100. When viewed in a plan view, the first through holes F1 may have a shape extending in a first direction.

The first through holes F1 may have a width in the range of about 80 μm to about 200 μm.

The back electrode layer 200 is divided into a plurality of back electrodes by the first through holes F1. That is, the back electrodes are defined by the first through holes F1.

The back electrodes are spaced apart from each other by the first through holes F1. The back electrodes are arranged in the form of a stripe.

In addition, the back electrodes may be arranged in the form of a matrix. In this case, when viewed in a plan view, the first through holes F1 may be provided in the form of a lattice.

The light absorbing layer 300 is provided on the back electrode layer 200. In addition, a material constituting the light absorbing layer 300 is filled in the first through holes F1.

The light absorbing layer 300 includes a group I-III-VI compound. For example, the light absorbing layer 300 may have a Cu(In,Ga)Se2 (CIGS) crystal structure, a Cu(In)Se2 crystal structure, or a Cu(Ga)Se2 crystal structure.

The light absorbing layer 300 may have an energy bandgap in the range of about 1 eV to about 1.8 eV.

The buffer layer 400 is provided on the light absorbing layer 300. The buffer layer 400 makes direct contact with the absorbing layer 300.

As not depicted, the high resistance buffer layer may be provided on the buffer layer 400. The high-resistance buffer layer 500 may include i-ZnO, which is zinc oxide not doped with impurities. The high resistance buffer layer 500 has an energy bandgap in the range of about 3.1 eV to about 3.3 eV.

The light absorbing layer 300 and the buffer layer 400 are formed therein with second through holes F2. The second through holes F2 are formed through the light absorbing layer 300. Further, the second through holes F2 are open regions to expose the top surface of the back electrode layer 200.

The second through holes TH2 are adjacent to the first through holes F1. Further, when viewed in a plan view, portions of the second through holes F2 are formed beside the first through holes F1. The second through holes F2 have a shape extending in the first direction.

Each second through holes F2 may have a width in the range of about 80 μm to about 200 μm.

A plurality of light absorbing parts is defined in the light absorbing layer 300 by the second through holes F2. That is, the light absorbing layer 300 is divided into the light absorbing parts by the second through holes F2.

A plurality of buffers is defined in the buffer layer 400 by the second through holes F2. That is, the buffer layer 400 is divided into a plurality of buffers by the second through holes F2.

The front electrode layer 500 is provided on the light absorbing layer 300. In more detail, the front electrode layer 500 is provided on the buffer layer 400. The front electrode layer 500 is transparent, and includes a conductive layer. In addition, the front electrode layer 500 has resistance greater than that of the back electrode layer 200.

The front electrode layer 500 includes an oxide. For example, the front electrode layer 500 may include an Al doped zinc oxide (AZO), an indium zinc oxide (IZO), or an indium tin oxide (ITO).

The front electrode layer 500 may have a thickness in the range of about 500 nm to about 1.5 μm. The front electrode layer 500 may be automatically patterned through the second through holes F2. Further, when the front electrode layer 500 may formed of the Al doped zinc oxide, the aluminum may be doped at a rate in the range of about 2.5 wt % to about 3.5 wt %. The front electrode layer 500 is a conductive layer.

The front electrode layer 500 is divided into a plurality of front electrodes by the second through holes F2. That is, the front electrodes are defined by the third through holes F3.

The front electrodes are arranged in the form of a stripe. In addition, the front electrodes may be arranged in the form of a matrix.

In addition, a plurality of cells C1, C2, . . . , are defined by the second through holes TH2. That is, the solar cell apparatus according to the embodiment is divided into the cells C1, C2, . . . , by the second through holes F2. In addition, the cells C1, C2, . . . , are connected to each other in the second direction crossing the first direction. That is, current may flow through the cells C1, C2, . . . , in the second direction.

The connectors 600 are disposed in an inner side of the second through holes F2. The connectors 600 may be placed on the third electrode part 230. The connectors 600 may be connected to a top surface of the third electrode part 230 and a side surface 221 of the second electrode part 220. That is, a contact area between the connectors 600 and the back electrode layer 200 may be increased. Thus, the contact resistance and the serial resistance may be reduced, and the fill factor may be increased. Therefore, the performance of the solar cell apparatus can be improved.

The connection parts 600 extend downward from the front electrode layer 500 to connect to the back electrode layer 200. For example, the connection parts 600 extend from the front electrode of the first cell C1 to connect to the back electrode of the second cell C2.

Therefore, the connection parts 600 connect mutually-adjacent solar cells to each other. In more detail, the connection parts 600 connect the front electrode and the back electrode, which are included in the adjacent cells C1, C2, . . . , to each other.

The connection part 600 is integrally formed with the front electrode layer 500. That is, the material constituting the connection part 600 is the same as a material constituting the front electrode layer 500.

Hereinafter, a solar cell apparatus according to a second embodiment will be described with reference to FIG. 4. In the following description, for the purpose of clear and simple explanation, the details of structures and components the same as those in the first embodiment or similar to those in the first embodiment will be omitted.

FIG. 4 is a sectional view showing a panel of the solar cell apparatus according to the second embodiment.

Referring to FIG. 4, in the solar cell apparatus according to the second embodiment, the front electrode layer 500 or the connection part 600 may be connected to a top surface 231 of the third electrode part 230, and a side surface 221 and a top surface of the second electrode part 220. Thus, contact areas between the connection parts 600 and the back electrode layer 200 may be increased. Therefore, contact resistance and series resistance may be reduced, and fill factor may be increased. Thus, the performance of the solar cell apparatus may be improved.

Hereinafter, a method of fabricating the solar cell apparatus according to the first embodiment will be described with reference to FIGS. 5 to 10. FIGS. 5 to 10 are views illustrating a procedure of fabricating the solar cell apparatus according to the first embodiment.

Referring FIG. 5, in a step of forming the back electrode layer 200 on a substrate, the back electrode 200 is formed on the support substrate 100. For example, a material used for the back electrode layer 200 includes molybdenum. The back electrode layer 200 may be prepared as two layers or more by performing the process under mutually different conditions.

Referring to FIG. 6, the back electrode layer 200 is patterned to form the first through holes F1. Thus, the plurality of back electrodes is formed on the support substrate 100. The back electrode layer 200 is patterned by using a laser device.

The back electrode layer 200 may be etched through a step of etching the back electrode layer 200. In the etching step, the back electrode layer 200 may be etched to have the first to third electrode parts 210 to 230. That is, the back electrode layer 200 may be etched to have the first to third electrode parts 210 to 230 which have first to third thicknesses TH1 to TH3, respectively.

In the etching step, half-tone etching may be performed. The half-tone etching is performed using a mask fabricated by using photoresist. In detail, according to the half-tone etching, the mask is prepared by varying transmittance of light applied thereto and then the etching is performed. In more detail, after preparing the mask having the a shape corresponding to the shape of the back electrode layer 200 to be fabricated is fabricated, the mask is placed on the back electrode layer 200, and the etching process is performed, so that the back electrode layer 200 having the shape corresponding to the shape of the mask can be fabricated.

The back electrode layer 200 may have a step difference and a rough top surface through the etching.

Referring to FIG. 7, a step of forming the light absorbing layer 300 on the back electrode layer 200 is performed. The light absorbing layer 300 may be formed through a sputtering process or an evaporation process.

For example, various schemes, such as a scheme of forming a Cu(In,Ga)Se2 (CIGS) based-light absorbing layer 300 by simultaneously or separately evaporating Cu, In, Ga, and Se and a scheme of performing a selenization process after a metallic precursor film has been formed, have been extensively used in order to form the light absorbing layer 300.

Regarding the details of the selenization process after the formation of the metallic precursor layer, the metallic precursor layer is formed on the back electrode layer 200 through a sputtering process employing a Cu target, an In target, or a Ga target.

Thereafter, the metallic precursor layer is subject to the selenization process so that the Cu (In, Ga) Se2 (CIGS) based light absorbing layer 300 is formed.

In addition, the sputtering process employing the Cu target, the In target, and the Ga target and the selenization process may be simultaneously performed.

Further, a CIS or a CIG based light absorbing layer 300 may be formed through the sputtering process employing only Cu and In targets or Cu and Ga targets and the selenization process.

Then, referring to FIG. 8, a step of forming the buffer layer 400 on the light absorbing layer 300 is performed. In the step, the buffer layer 400 is formed by depositing CdS on the light absorbing layer 300 through a sputtering process or a CBD (Chemical Bath Deposition) scheme.

Thereafter, as not shown, the high resistance buffer layer 500 is formed by depositing zinc oxide on the buffer layer 400 through a sputtering process.

The buffer layer 400 and the high resistance buffer layer 500 are deposited at a thin thickness. For example, the thickness of the buffer layer 400 and the high resistance buffer layer 500 is in the range of about 1 nm to about 80 nm.

Referring to FIG. 9, a step of forming the front electrode layer 500 on the buffer layer 400 is performed. The front electrode layer 500 may be formed by depositing a transparent conductive material such as aluminum (Al) doped zinc oxide (AZO) on the buffer layer 400 through a sputtering process.

Referring to FIG. 10, a part of the light absorbing layer 300 and the buffer layer 400 is removed to form the second through holes F2. The top surface of the third electrode part 230 may be exposed through the second through holes F2.

The second through holes F2 may be formed by a laser device or a mechanical apparatus such as a tip.

The light absorbing layer 300 and the buffer layer 400 may be mechanically patterned by a tip. The width of the tip may be in the range of about 40 µm to about 180 µm.

The transparent conductive material may be deposited in the second through holes F2 to form the connection part. Thus, the connection part may be connected to the top surface 231 of the third electrode part 230 and the side surface 221 of the second electrode part 220.

Further, the third through holes F3 are formed at the light absorbing layer 300, the buffer layer 400 and the front electrode layer 500. The third through holes F3 are formed through the light absorbing layer 300, the buffer layer 400 and the front electrode layer 500. Further, the third though holes F3 may expose a part of the top surface of the second electrode part 220.

The third through holes F3 are adjacent to the second through holes F2. In more detail, the third through holes F3 are disposed beside the second through holes F2. That is, when viewed in a plan view, the third through holes F3 are disposed in parallel with and beside the second through holes F2. The third through holes F3 may have a shape extending in the first direction.

The front electrode layer 500 is divided into a plurality of front electrodes by the second and third through holes F2 and F3. That is, the front electrodes are defined by the second and third through holes F2 and F3.

In addition, a plurality of cells C1, C2, . . . , and Cn are defined by the third through holes F3. In more detail, the cells C1, C2, . . . , and Cn are defined by the second and third through holes F2 and F3. That is, the solar cell apparatus according to the embodiment is divided into the cells C1, C2, . . . , and Cn by the second and third through holes F2 and F3. In addition, the cells C1, C2, . . . , and Cn are connected to each other in a second direction crossing the first direction. That is, current may flow in the second direction through the cells C1, C2, . . . , and Cn.

The front electrodes may be certainly distinguished from each other by the third through holes F3. That is, by the third through holes F3, the cells may be distinguished from each other. Thus, the third through holes F3 can prevent the front electrodes from being short-circuited.

Hereinafter, a method of fabricating a solar cell apparatus according to the second embodiment will be described with reference to FIG. 11. FIG. 11 is a view illustrating a procedure of fabricating a panel of a solar cell apparatus according to the second embodiment.

In the method of fabricating the solar cell apparatus according to the second embodiment, the second through holes F2 and the third through holes F3 may be integrally formed without being distinguished from each other. Thus, a connection part formed on them may make contact with the top surface of the third electrode part 230 and the top and side surfaces of the second electrode part 220. That is, by ensuring larger contact area, efficiency of the solar cell apparatus can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell apparatus comprising:
a support substrate;
a back electrode layer stacked on the support substrate;
a light absorbing layer stacked on the back electrode layer;
a buffer layer stacked on the light absorbing layer; and
a front electrode layer stacked on the buffer layer,
wherein the back electrode layer comprises:
a first back electrode layer; and
a second back electrode layer;
wherein the first back electrode layer comprises:
a first electrode part having a first thickness;
a second electrode part adjacent to the first electrode part and having a second thickness smaller than the first thickness; and
a third electrode part adjacent to the second electrode part and having a third thickness smaller than the second thickness,
wherein the second back electrode layer comprises:
a fourth electrode part having a fourth thickness;
a fifth electrode part adjacent to the first electrode part and having a fifth thickness smaller than the fourth thickness; and
a sixth electrode part adjacent to the second electrode part and having a sixth thickness smaller than the fifth thickness,
wherein the second electrode part is disposed on a lateral side of the first electrode part,
wherein the third electrode part is disposed on a lateral side of the second electrode part,
wherein the fifth electrode part is disposed on a lateral side of the fourth electrode part,
wherein the sixth electrode part is disposed on a lateral side of the fifth electrode part,
wherein the third electrode part is spaced apart from the sixth electrode part, and
wherein the front electrode layer is in direct contact with a top surface of the sixth electrode part and the lateral side of the fifth electrode part;
wherein a bottom surface of the first electrode part, a bottom surface of the second electrode part, a bottom surface of the third electrode part, a bottom surface of the fourth electrode part, a bottom surface of the fifth electrode part, and a bottom surface of the sixth electrode part are in direct contact with a top surface of the support substrate;

wherein a distance between the third electrode part and the sixth electrode part is smaller than a distance between the second electrode part and the fifth electrode part, wherein a distance between the second electrode part and the fifth electrode part is smaller than a distance between the first electrode part and the fourth electrode part, wherein the light absorbing layer comprises:

a first light absorbing layer;

a second light absorbing layer spaced apart from the first light absorbing layer; and a third light absorbing layer spaced apart from the first and second light absorbing layers:

wherein the first light absorbing layer is in direct contact with a top surface of the first electrode part, the lateral side of the first electrode part, a top surface of the second electrode part, the lateral side of the second electrode part, a top surface of the third electrode part, the lateral side of the third electrode part, a top surface of the support substrate, the lateral side of the sixth electrode part, and a portion of a top surface of the sixth electrode part;

wherein the second light absorbing layer is in direct contact with a portion of a top surface of the fifth electrode part, and wherein the third light absorbing layer is in direct contact with a top surface of the fourth electrode part.

2. The solar cell apparatus of claim 1, wherein the first electrode part, the second electrode part, and the third electrode part are integrally formed with one another.

3. The solar cell apparatus of claim 1, wherein the first thickness is 1 μm or less.

4. The solar cell apparatus of claim 1, wherein the third thickness is 500 nm or less.

5. The solar cell apparatus of claim 1, wherein the first back electrode layer has a step difference.

6. The solar cell apparatus of claim 1, wherein the top surface of the support substrate is exposed by a through hole of the back electrode layer.

7. The solar cell apparatus of claim 1, wherein:
the light absorbing layer comprises light absorbing parts, and
the buffer layer comprises a plurality of buffers.

8. The solar cell apparatus of claim 1, wherein the front electrode layer has resistance greater than that of the back electrode layer.

9. The solar cell apparatus of claim 1, wherein the second back electrode layer has a step difference.

10. The solar cell apparatus of claim 1, wherein the first thickness is equal to the fourth thickness.

11. The solar cell apparatus of claim 1, wherein the second thickness is equal to the fifth thickness.

12. The solar cell apparatus of claim 1, wherein the third thickness is equal to the sixth thickness.

13. The solar cell apparatus of claim 1, wherein the fourth electrode part, the fifth electrode part, and the sixth electrode part are integrally formed with one another.

* * * * *